United States Patent [19]

Aoyama

[11] Patent Number: 4,480,321
[45] Date of Patent: Oct. 30, 1984

[54] SEMICONDUCTOR MEMORY DEVICE
[75] Inventor: Keizo Aoyama, Yamato, Japan
[73] Assignee: Fujitsu Limited, Kawasaki, Japan
[21] Appl. No.: 411,008
[22] Filed: Aug. 24, 1982
[30] Foreign Application Priority Data Aug. 24, 1981 [JP] Japan ................. 56-132406

[51] Int. Cl.³ .................................. G11C 11/40
[52] U.S. Cl. ...................... 365/189; 365/230; 365/200
[58] Field of Search .............. 365/174, 182, 189, 200, 365/230

[56] References Cited
U.S. PATENT DOCUMENTS
4,445,203  4/1984  Iwahashi .................. 365/189

Primary Examiner—Terrell W. Fears
Attorney, Agent, or Firm—Staas & Halsey

[57] ABSTRACT

A semiconductor memory device, such as a metal-insulator semiconductor random access memory device, in which erroneous write in which may occur when an input address signal is switched, is prevented. The semiconductor memory device comprises an input-/output circuit, having an input circuit portion which receives input data and supplies the input data to a pair of data buses and an output circuit portion which amplifies signals from the pair of data buses and outputs therefrom, and a circuit for detecting a change in input address signal and generating a pulse having a predetermined pulse width when the input address signal changes. The input circuit portion of the input/output circuit operates so as to inhibit the writing in of data during generation of the pulse even if the write-enable signal is supplied to the memory device and operates in accordance with the write-enable signal when the pulse is not generated.

16 Claims, 8 Drawing Figures

Fig. 3
PRIOR ART
Fig. 4
Fig. 5
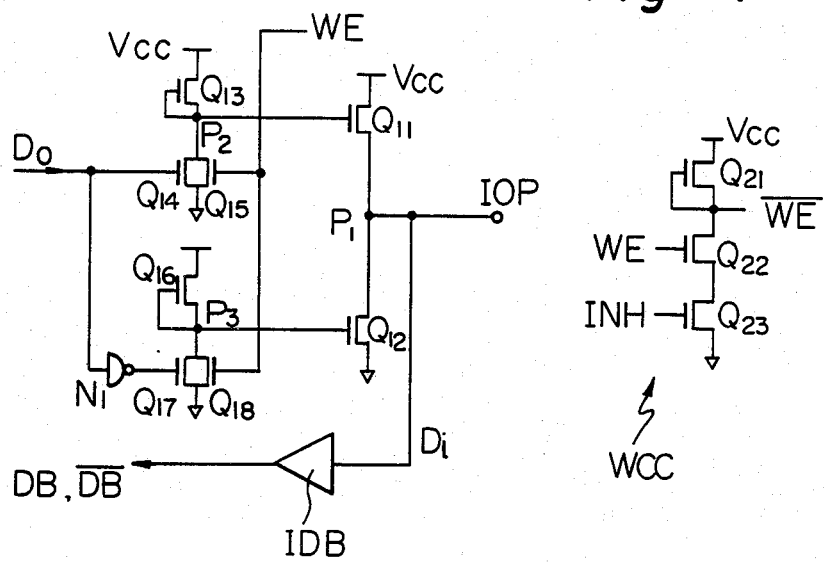
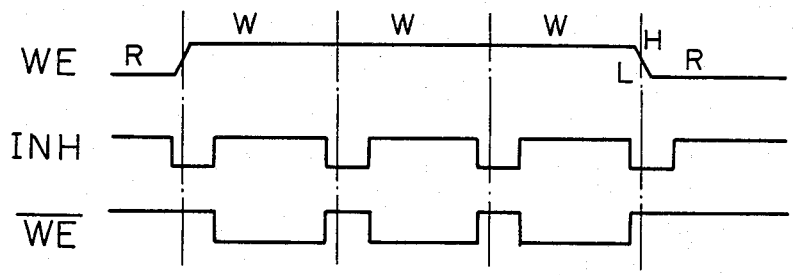

SEMICONDUCTOR MEMORY DEVICE

BACKGROUND OF THE INVENTION

(1) Field of the Invention

The present invention relates to a semiconductor memory device and more particularly to a semiconductor memory device such as a metal-insulator semiconductor (MIS) random access memory (RAM) device in which when an input address signal is switched erroneous write in is prevented.

(2) Description of the Prior Art

As illustrated in FIG. 1, a conventional MIS static-type RAM device comprises memory cells MC which are respectively connected between word lines W1, W2, - - - and bit line pairs B0 and B1, - - - . Although the RAM device comprises a plurality of bit line pairs, only a single bit line pair B0 and B1 is illustrated in FIG. 1. Each of the memory cells MC, for example, memory cell MC0, comprises load resistors R1 and R2, a flip-flop circuit comprising MIS transistors Q1 and Q2, and transfer gates each comprising MIS transistor Q3 or Q4. One end of each of the bit lines B0 and B1 of the bit line pair is connected to the power source $V_{CC}$ through transistors Q5 and Q6, respectively. The other end of each of bit lines B0 and B1 is connected to data buses DB and $\overline{DB}$ through column-selecting transistors Q7 and Q8.

In the RAM device of FIG. 1, when the potential of a word line, for example, W1, is changed from low to high, transistors Q3 and Q4 are turned on and memory cell MC0 is connected to the pair of bit lines B0 and B1. In this state, if column-selecting signal Y1 is changed from low to high, transistors Q7 and Q8 are turned on and bit lines B0 and B1 are connected to data buses DB and $\overline{DB}$, respectively. Thereby, memory cell MC0 disposed at the intersection between word line W1 and the pair of bit lines B0 and B1 is selected. When the memory cell MC0 is selected, if the potentials of bit lines B0 and B1 are rendered to be high and low, respectively, through data buses DB and $\overline{DB}$, transistor Q2 of the memory cell MC0 is turned on and transistor Q1 thereof is turned off, thereby effecting the writing in of data. In order to read out data thus written in, the potentials of word line W1 and column-selecting signal Y1 are pulled up to high. In this case, when the potential of the word line W1 changes from low to high, transistors Q3 and Q4 are both turned on, and the relatively high potential of a point a and the relatively low potential of a point b of memory cell MC0 are transferred to bit lines B0 and B1, respectively. The potentials of bit lines B0 and B1 thus transferred from the memory cell MC0 are transferred to a readout circuit (not shown) through transistors Q7 and Q8 and data buses DB and $\overline{DB}$.

When information is written into a memory cell of a semiconductor memory device, write-enable signal WE is supplied to the memory chip of the semiconductor memory device. In the semiconductor memory device, write-enable signal WE is supplied to a buffer circuit, i.e., an inverter circuit, and inverted signal $\overline{WE}$ of write-enable signal WE output therefrom changes the memory device from a readout mode to a write in mode. A memory cell in which data is written in or a memory cell in which data is read out is designated by an address signal. The address signal has a plurality of bits, and some of the upper bits and all of lower bits are, respectively, used as a word address signal for selecting a word line and as a bit address signal for selecting a pair of bit lines.

As illustrated in FIG. 2, if, at time t2, input address signal A has changed so that word line Wi which was selected changes to a non-selected condition and word line Wj is selected instead of word line Wi, the potential of word line Wi changes from high to low and the potential of word line Wj changes from low to high. In this case, since the fall time of the potential of the word line Wi and the rise time of the potential of the word line Wj can not be negligibly small, there occurs a condition in which the potentials of word lines Wi and Wj both become high. In this condition, if the potentials corresponding to data to be written in next are applied to a bit line pair, the erroneous write in of data is possible, that is, there is a possibility that the data to be written in next will be written into memory cell MC0 in which data has just been written in.

In order to prevent such a phenomenon, a conventional memory device inhibits the writing of data in a memory cell for a short time during the switching period of input address signal A by rendering write-enable signal WE low and inverted write-enable signal $\overline{WE}$ high. As illustrated in FIG. 3, an input/output circuit of a conventional memory device comprises an output stage which comprise transistors Q11 through Q18 and inverter N1 and which receives readout data DO from, for example, a sense amplifier (not shown), and an input stage having input data buffer IDB which supplies write in data to a pair of data buses. The output stage of the input/output circuit of FIG. 3 comprises a series circuit of transistors Q11 and Q12 whose output terminal P1 is connected to I/O port IOP which is also connected to an input terminal of input data buffer IDB. The series circuit of transistors Q11 and Q12 exhibits three states, i.e., a state of high potential level, a state of low potential level, and a state of high impedance.

When writing of data into the memory device is effected, transistors Q11 and Q12 are both turned off and the output stage is in a high impedance state so that write in data Di is transferred from I/O port IOP to input data buffer IDB without being affected by the output stage. In order to obtain a high impedance state, external write-enable signal WE is applied to the gates of transistors Q15 and Q18. Transistors Q15 and Q18 are connected in parallel with transistors Q14 and Q17, respectively, and connected in series with transistors Q13 and Q16, respectively. Transistors Q13 and Q14 and transistors Q16 and Q17 constitute inverters whose outputs are both rendered low by external write-enable signal WE. That is, when external write-enable signal WE is high, transistors Q15 and Q18 are both turned on and outputs P2 and P3 of the upper stage inverter and the lower stage inverter both become low. Therefore, transistors Q11 and Q12 are both turned off and the impedance of the output stage becomes high.

When readout of data from the memory device is effected, external write-enable signal WE is rendered to be low so that transistors Q15 and Q18 are both turned off. Transistor Q14 is turned on and off and transistor Q17 is turned off and on in accordance with the high and low, i.e., "1" and "0", of readout data DO. Therefore, output signal P2 becomes low and high, and output signal P3 becomes high and low in accordance with the high and low of readout data DO so that output signal P1 of the final stage comprising transistors Q11 and Q12 becomes low and high. Output signal P1 is transferred to I/O port IOP without being affected by input data buffer IDB because input data buffer IDB has a high input impedance.

As mentioned before, in the input/output circuit of FIG. 3, write-enable signal WE must be rendered low every time the input address signal changes its state, even when write in is continuously effected. When write-enable signal WE is low, transistors Q11 and Q12 of the output stage change from a condition in which transistors Q11 and Q12 are both turned off to a condition in which one of transistors Q11 and Q12 is turned on and the other is turned off. When write-enable signal WE again becomes high, transistors Q11 and Q12 both are again turned off. Therefore, transistors Q11 and Q12 of the output stage repeatedly change their condition from one in which they are both turned off to one in which one of them is turned on and the other is turned off and vice versa. Since the size of each of transistors Q11 and Q12 of the output stage is large and the stray capacitances between the gate and the drain and between the gate and the source, etc., are large, the rise time and the fall time of output signal P1 becomes long and the effective time for the write in operation becomes short. Therefore, it is necessary to increase the write in time so that the write in speed is slow.

In order to avoid a condition in which the potential of the word line Wi, which is selected first, and the potential of the word line Wj, which is selected after word line Wi, are both high, it is possible to put time interval T between the switching times of the signals on word lines Wi and Wj, as shown by Wi' and Wj' of FIG. 2, when a selected word line is switched from Wi to Wj. In this method, external write-enable signal WE is maintained at a high level during a continuous write in period, and it is not necessary to render the write-enable signal low every time the input address signal changes its state.

However, putting time interval T between the switching times of the signals on the word lines Wi and Wj requires word line drivers having complex structures, and, moreover, the readout time of a memory device employing such a system becomes long.

SUMMARY OF THE INVENTION

It is the principal object of the present invention to prevent the erroneous write in of data in a previously selected memory cell when an input address signal changes without using a complex external circuit which renders the write-enable signal to be low every time the input address signal changes.

According to the present invention, there is provided a semiconductor memory device in which switching from a readout mode to a write in mode and vice versa is effected on the basis of a write-enable signal applied thereto, the semiconductor memory device comprising: a plurality of memory cells; a data bus operatively connected to the memory cells; an input/output circuit having an input circuit portion which receives an input data and supplies it to the data bus and an output circuit portion which outputs a readout data from the data bus; and a circuit for detecting a change in an input address signal, the circuit generating a pulse having a predetermined pulse width when the input address signal has changed, wherein the input circuit portion of the input-/output circuit operates so as to inhibit the writing in of data during generation of the pulse even if the write-enable signal is supplied to the memory device and operates in accordance with the write-enable signal when the pulse is not generated.

BRIEF DESCRIPTION OF THE DRAWINGS

FIG. 3 is a circuit diagram of an input/output circuit used in a conventional RAM device;

FIG. 4 is a circuit diagram of a write in control circuit used in a semiconductor memory device according to the present invention;

FIG. 5 is a waveform diagram of the operation of the circuit of FIG. 4;

DESCRIPTION OF THE PREFERRED EMBODIMENT

FIG. 4 is an example of a write in control circuit used in a semiconductor memory device according to the present invention. The write in control circuit of FIG. 4 comprises MIS transistors Q21 through Q23. In FIG. 4, WE is an external write-enable signal, and INH is an inhibit signal which is generated in the chip of the semiconductor memory device and which is used for inhibiting the writing in of data during a switching period of an input address signal. The semiconductor memory device according to the present invention uses output signal $\overline{WE}$ from the write in control circuit of FIG. 4 as a write in control signal.

FIG. 5 is a waveform diagram of the signals of every node of the circuit of FIG. 4. Output signal, i.e., write in control signal $\overline{WE}$ from the circuit of FIG. 4 becomes low only when external write-enable signal WE and inhibit signal INH are both high, thereby rendering the memory chip to be in the write in mode. When write-enable signal WE is low, i.e., when the memory chip does not receive a write in command from the central processing unit (CPU) system (not shown), output signal $\overline{WE}$ becomes high and the memory chip is in the readout mode. When write-enable signal WE is high, i.e., when the memory chip receives a write-in command from the CPU system, and inhibit signal INH is low, output signal $\overline{WE}$ becomes high and the writing in of data in the memory chip is inhibited. Thus, the write in operation during a switching time of an input address signal is inhibited and erroneous write in is prevented.

Figure 1:
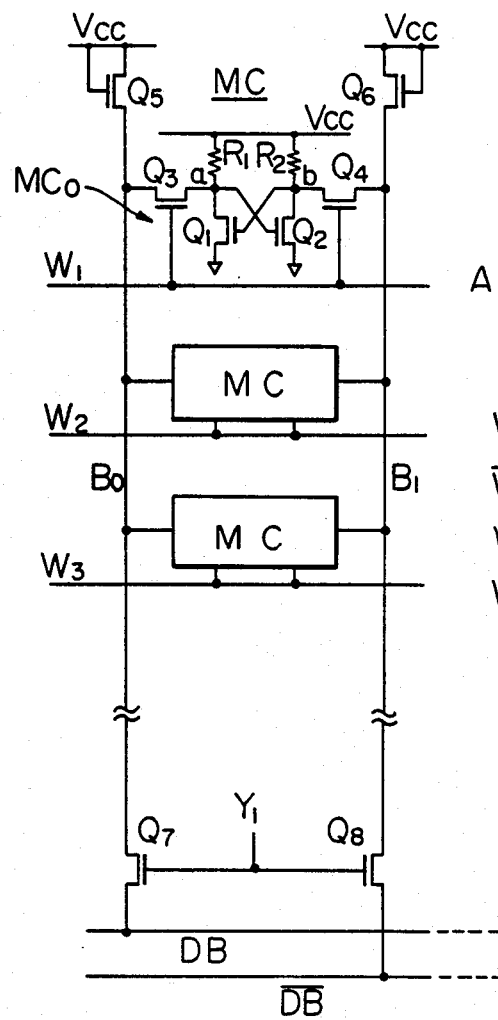
FIG. 1 is a block circuit diagram of a conventional MIS static-type RAM device.
Figure 2:
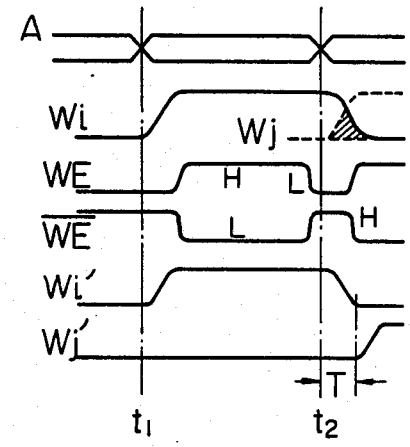
FIG. 2 is a waveform diagram of the operation of the RAM device of FIG. 1.
Figure 6:
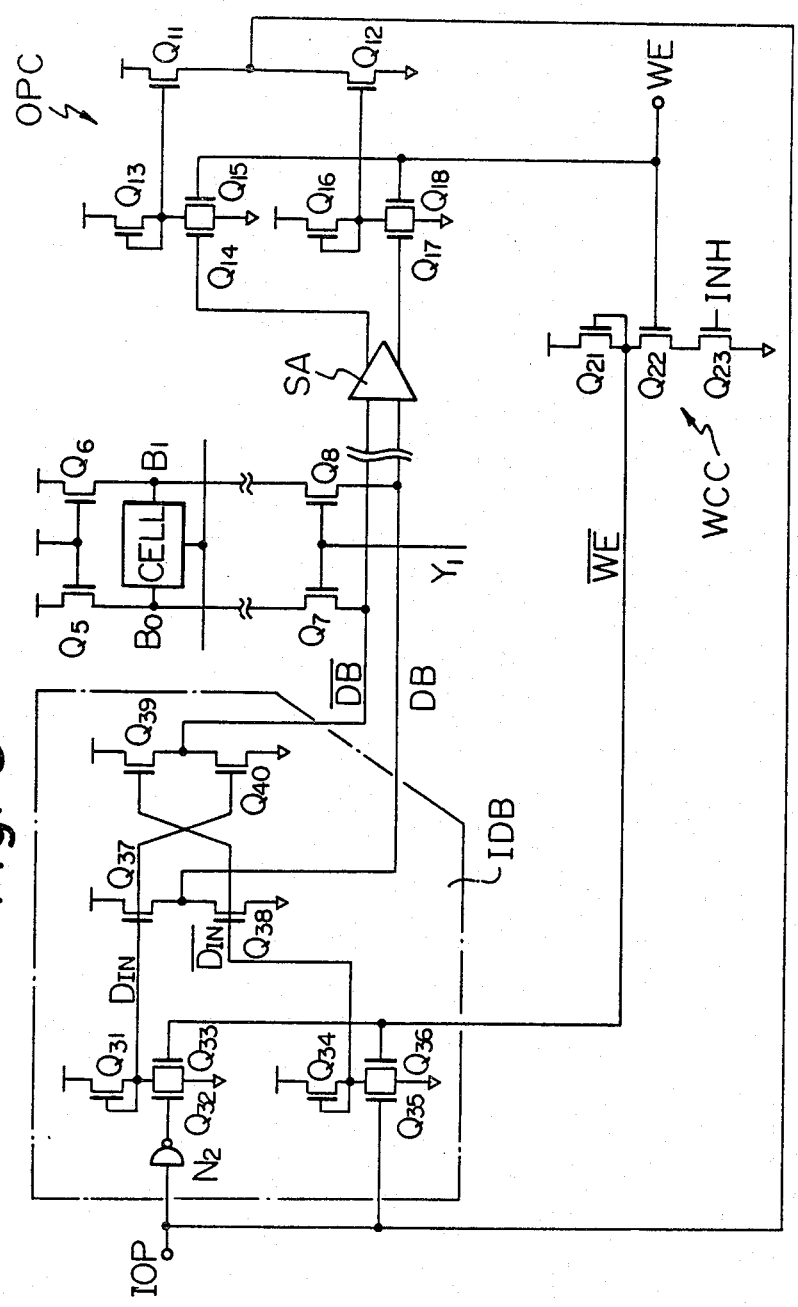
FIG. 6 is a block circuit diagram of a semiconductor memory device including an input/output circuit as an embodiment of the present invention.

FIG. 6 is a circuit of a semiconductor memory device, as an embodiment of the present invention, including input data buffer IDB, which is controlled by write in control signal $\overline{WE}$ mentioned above. The memory device of FIG. 6 comprises, in addition to input data buffer IDB, a memory matrix portion which is illustrated in FIG. 1, sense amplifier SA, output circuit OPC which comprises MIS transistors Q11 through Q18 and which is included in the circuit of FIG. 3, and write in control circuit WCC illustrated in FIG. 4.

Operation of input data buffer IDB in FIG. 6 is now described. If write-in control signal $\overline{WE}$ is low, i.e., in the write in mode, transistors Q33 and Q36 are turned off. In this condition, if the input signal from input/output port IOP is high, the potential of the gate of transistor Q32 becomes low owing to inverter N2 and the potential of the gate of transistor Q35 becomes high. Therefore, transistor Q32 is turned off and transistor Q35 is turned on so that signal DIN from an inverter comprising transistors Q31 and Q32 becomes high and signal $\overline{\text{DIN}}$ from an inverter comprising transistors Q34 and Q35 becomes low. As a result, transistors Q37 and Q40 are turned on and transistors Q38 and Q39 are turned off. Thereby, the potentials of data buses DB and $\overline{\text{DB}}$ become high and low, respectively. The potential levels of data buses DB and $\overline{\text{DB}}$ are transferred to bit lines B0 and B1 and the writing in of data in memory cell MC0 is effected.

In a readout mode, i.e., in a condition in which write in control signal $\overline{\text{WE}}$ is high, transistors Q33 and Q36 are both turned on and signals DIN and $\overline{\text{DIN}}$ both become low regardless of the potential level of I/O port IOP so that transistors Q37 through Q40 are all turned off. Therefore, the potential levels of data buses DB and $\overline{\text{DB}}$ are not restricted to values applied from input data buffer IDB, rather, they are determined by the potentials of the selected bit lines whose potential levels are determined by the information stored in a selected memory cell. The potentials of data buses DB and $\overline{\text{DB}}$ are amplified by sense amplifier SA and are output from I/O port IOP via output circuit OPC.

Figure 7A:
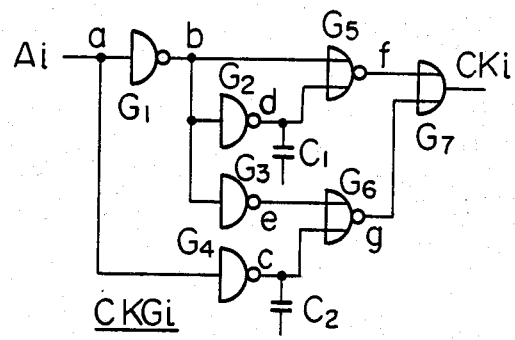
FIGS. 7A and 7B are block circuit diagrams of an inhibit-signal generator circuit used in the semiconductor memory device of FIG. 6.
Figure 7B:
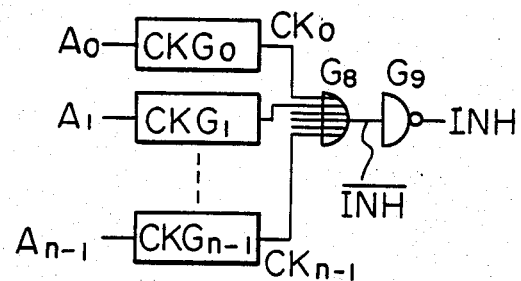

FIGS. 7A and 7B are inhibit-signal generators for generating inhibit signal INH. In FIG. 7A, G1 through G4 are inverters, G5 and G6 are NOR gates, and G7 is an OR gate. These inverters and gates G1 through G7 are connected in the manner illustrated in FIG. 7A and comprises an inhibit-signal generator unit CKGi (i=0, ..., n−1). The symbols C1 and C2 are capacitors connected between the output of inverter G2 and ground and between the output of inverter G4 and ground, respectively. Inhibit-signal generator unit CKGi receives one bit $A_i$ from an input address signal having one or more bits $A_0$ through $A_{n-1}$ and outputs clock signal CKi. Inhibit-signal generator unit CKGi is provided for each bit of the input address signal. Output clock signals CK0, CK1, ..., $CK_{n-1}$ from inhibit-signal generator unit CKG0, CKG1, ..., $CKG_{n-1}$ are coupled with OR gate G8 so as to generate inhibit-signal INH as illustrated in FIG. 7B.

Figure 8:
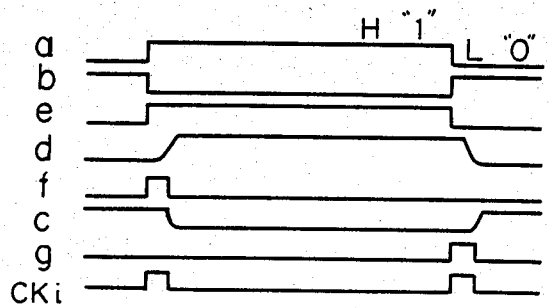
FIG. 8 is a waveform diagram of the operation of the inhibit-signal generator circuit of FIGS. 7A and 7B.

Operation of the inhibit-signal generator circuit of FIGS. 7A and 7B will be explained with reference to FIG. 8. In the generator unit of FIG. 7A, when input address bit $A_i$ of node a changes from high (H), i.e., from "1" to low (L), i.e., "0", and vice versa, the output signal of inverter G1 at node b changes from low to high and vice versa, as illustrated in FIG. 8(b). Due to capacitor C1, inverter G2 outputs a signal at node d which is slightly delayed at each rising edge thereof. Therefore, NOR gate G5 outputs a pulse signal which is generated at each rising edge of address bit $A_i$, as illustrated in FIG. 8(f). Another circuit comprising inverters G3 and G4, capacitor C2, and NOR gate G6 operates in a similar manner but outputs a pulse signal which is generated at each falling edge of address bit $A_i$, as illustrated in FIG. 8(g). Therefore, OR gate G7 outputs clock signal CKi, which is generated at every transient time of address bit $A_i$, and, as a result, OR gate G8 of the circuit of FIG. 7B outputs signal $\overline{\text{INH}}$, which is generated when at least one of address bits $A_0$ through $A_{n-1}$ has changed. Signal $\overline{\text{INH}}$ is inverted by inverter G9 so that the necessary inhibit signal INH is obtained.

As mentioned above, according to the present invention, an external write-enable signal supplied to a memory chip can be a continuous signal having a constant potential level during the write in time, i.e., the potential level does not change to a low level every time an input address changes. Therefore, the present invention does not necessitate the use of an external circuit having a complicated structure, and it is possible to supply a write in command to the memory chip directly from the CPU system. In a semiconductor memory device according to the present invention, since an inhibit signal for inhibiting the writing in of data in the memory device during a switching time of an input address signal is generated within the memory device, erroneous write in at the switching time of the input address signal is prevented. Moreover, since a continuous external write-enable signal is applied to the output stage for the readout of data and the output stage is continuously maintained at a high impedance during the write in operation, the write in time period can be relatively long and unnecessary power consumption due to switching of the write-enable signal can be prevented.

I claim:

1. A semiconductor memory device having an input address signal and write in data in which switching from a readout mode to a write in mode and vice versa is effected on the basis of a write-enable signal applied thereto, the semiconductor memory device comprising:
   a plurality of memory cells;
   a data bus operatively connected to said plurality of memory cells;
   an input/output circuit, operatively connected to said data bus, having an input circuit portion for receiving input data and supplying it to said data bus, and having an output circuit portion for outputting readout data from the data bus; and
   a circuit, operatively connected to said input/output circuit, for detecting when the input address signal changes, said circuit generating a pulse having a predetermined pulse width when the input address signal has changed, wherein the input circuit portion of said input/output circuit operates to inhibit the writing in of the write in data during the generation of the pulse even when the write-enable signal is supplied to the memory device and wherein said input circuit portion operates in accordance with the write-enable signal when the pulse is not generated.

2. A semiconductor memory device according to claim 1, wherein said input/output circuit further comprises a write in control circuit, operatively connected between said input circuit portion and said output circuit portion of said input/output circuit, comprising a series connection of a first load transistor and first and second switching transistors, said first switching tansistor being controlled by the write-enable signal and said second switching transistor being controlled by the pulse from the circuit for detecting when the input address signal changes, wherein a common connection node is formed between said load transistor and said first switching transistor, and wherein said common connection node outputs a write in control signal to control the operation of said input circuit portion of said input/output circuit.

3. A semiconductor memory device according to claim 2, wherein said input circuit portion of said input/output circuit, comprises first and second inverters, operatively connected to receive non-inverted and inverted signals of the write in data, for outputting inverted signals of the non-inverted and inverted signals, respectively, when the write in control signal is supplied to said first and second inverters and for generating signals having the same potential level when the write in control signal is not supplied to said first and second inverters.

4. A semiconductor memory device according to claim 3, wherein said first and second inverters each comprise a second load transistor and a parallel connection of third and fourth switching transistors having a connection node therebetween, said parallel connection of said third and fourth switching transistors being operatively connected in series with said second load transistor, wherein said third switching transistor is controlled by the write in control signal and said fourth transistor is controlled by the write in data supplied to the semiconductor memory device.

5. A semiconductor memory device according to claim 1, wherein said output circuit portion is directly controlled by the write-enable signal supplied to the semiconductor memory device.

6. A semiconductor memory device according to claim 5, wherein said output circuit portion comprises:
  a sense amplifier, operatively connected to said data bus, for outputting a non-inverted and inverted signal;
  first and second inverters, operatively connected to said sense amplifier and operatively connected to receive the write-enable signal, the non-inverted output signal and the inverted output signal from said sense amplifier, for outputting inverted signals of the non-inverted and inverted signals, respectively, when the write-enable signal is not supplied to said first and second inverters and for outputting signals having the same potential level when the write-enable signal is supplied to said first and second inverters; and
  an output buffer circuit, operatively connected to said first and second inverters, having an output impedance that becomes high when said output signals from said first and second inverters have the same potential level.

7. A semiconductor memory device according to claim 6, wherein said first and second inverters each comprise a load transistor and a parallel connection of first and second switching transistors having a connection node therebetween, said parallel connection of said first and second transistors being operatively connected in series with said load transistor, said first switching transistor being controlled by said write-enable signal and said second transistor being controlled by the inverted and non-inverted output signals from said sense amplifier.

8. A semiconductor memory device according to claim 6, wherein said output buffer circuit comprises first and second transistors operatively connected in series, controlled by the output signals from said first and second inverters, respectively.

9. A semiconductor memory device according to claim 1, 2, 3, 4, 5, 6, 7, or 8, wherein the input address signal comprises a plurality of bits and wherein said circuit for detecting when the input address signal changes generates an inhibit pulse signal when at least one of said plurality of bits of the input address signal changes.

10. A semiconductor memory device according to claim 9, wherein said circuit for detecting when the input address signal changes, further comprises:
  at least one inhibit-signal generator unit, operatively connected to receive said plurality of bits of the input address signal, for detecting when at least one of said plurality of bits of the input address signal changes and for generating an inhibit pulse, accordingly; and
  an OR gate, operatively connected to said at least one inhibit-signal generator unit, for receiving the outputs from said at least one inhibit-signal generator unit so as to generate the inhibit pulse signal.

11. A semiconductor memory device according to claim 1, further comprising a common input/output terminal operatively connected to said input circuit portion and said output circuit portion.

12. A semiconductor memory device according to claim 1, wherein said input/output circuit comprises:
  a write in control circuit operatively connected between said input circuit portion and said output circuit portion, comprising:
    a first load transistor;
    a first switching transistor, operatively connected in series with said first load transistor forming a first connection node therebetween, for receiving the write-enable signal and outputting a write in control signal at said first connection node; and
  a second switching transistor, operatively connected in series with said first switching transistor and said detecting circuit, for receiving the pulse from said detecting circuit when the input address signal changes.

13. A semiconductor memory device according to claim 12, wherein said input circuit portion of said input/output circuit comprises:
  a first inverter, operatively connected to receive an inverted signal of the write in data and operatively connected to said first switching transistor, for outputting an inverted signal in dependence upon receipt of the write in control signal and for outputting a signal of the same potential level when the write in control signal is not received; and
  a second inverter, operatively connected to receive a non-inverted signal of the write in data and operatively connected to said first switching transistor, for outputting an inverted signal in dependence upon receipt of the write in control signal and for outputting a signal of the same potential level when the write in control signal is not received.

14. A semiconductor device according to claim 13, wherein said first and second inverters each comprise:
  a second load transistor;
  a third switching transistor, operatively connected to said second load transistor and forming a second connection node therebetween and operatively connected to said first switching transistor, for receiving the write in control signal; and
  a fourth switching transistor, operatively connected in parallel with said third switching transistor, for receiving the write in data.

15. A semiconductor memory device according to claim 1, further comprising a sense amplifier for outputting a non-inverted and inverted signal, wherein said output circuit portion comprises:
  a first inverter, operatively connected to said sense amplifier and operatively connected to receive the write-enable signal, for receiving the inverted output signal and outputting an inverted signal when the write-enable signal is received and outputting a signal having the same potential level when the write-enable signal is not received;

A second inverter, operatively connected to said sense amplifier and operatively connected to receive the write-enable signal, for receving the non-inverted output signal and outputting an inverted signal when the write-enable signal is received and outputting a signal having the same potential level when the write-enable signal is not received; and an output buffer circuit, operatively connected to said first and second inverters, having an output impedance that becomes high when said output signals from said first and second inverters have the same potential level.

16. A semiconductor memory device according to claim 15, wherein said first and second inverters each comprise:

a load transistor;

a first switching transistor, operatively connected in series with said load transistor at a connection node, for receiving the write-enable signal; and a second switching transistor, operatively connected in parallel with said first switching transistor and said sense amplifier, for receiving the output signals from said sensed amplifier.

* * * * *

UNITED STATES PATENT AND TRADEMARK OFFICE
CERTIFICATE OF CORRECTION

PATENT NO. : 4,480,321

DATED : OCTOBER 30, 1984

INVENTOR(S) : KEIZO AOYAMA

It is certified that error appears in the above-identified patent and that said Letters Patent is hereby corrected as shown below:

FRONT PAGE, [57] ABSTRACT,
line 10, "in" should be --in the--.

Col. 5, line 42, "unit" should be --units--.

Col. 9, line 3, "A" should be --a--.

Signed and Sealed this

Thirtieth Day of April 1985

[SEAL]

Attest:

DONALD J. QUIGG

Attesting Officer    Acting Commissioner of Patents and Trademarks